United States Patent
Kobayashi et al.

(10) Patent No.: US 11,955,353 B2
(45) Date of Patent: Apr. 9, 2024

(54) TEMPERATURE ADJUSTMENT DEVICE AND METHOD FOR MANUFACTURING TEMPERATURE ADJUSTMENT DEVICE

(71) Applicant: KELK Ltd., Kanagawa (JP)

(72) Inventors: Atsushi Kobayashi, Kanagawa (JP); Hideaki Ohkubo, Kanagawa (JP)

(73) Assignee: KELK Ltd., Kanagawa (JP)

( * ) Notice: Subject to any disclaimer, the term of this patent is extended or adjusted under 35 U.S.C. 154(b) by 559 days.

(21) Appl. No.: 17/284,228

(22) PCT Filed: Oct. 30, 2019

(86) PCT No.: PCT/JP2019/042606
§ 371 (c)(1),
(2) Date: Apr. 9, 2021

(87) PCT Pub. No.: WO2020/100597
PCT Pub. Date: May 22, 2020

(65) Prior Publication Data
US 2021/0358776 A1 Nov. 18, 2021

(30) Foreign Application Priority Data
Nov. 15, 2018 (JP) .................................. 2018-214948

(51) Int. Cl.
*G05D 23/00* (2006.01)
*H01L 21/67* (2006.01)
*H10N 10/01* (2023.01)

(52) U.S. Cl.
CPC .. *H01L 21/67103* (2013.01); *H01L 21/67051* (2013.01); *H10N 10/01* (2023.02)

(58) Field of Classification Search
CPC ...................................................... G05D 23/00
USPC ........................................................ 219/494
See application file for complete search history.

(56) References Cited

U.S. PATENT DOCUMENTS

| | | | |
|---|---|---|---|
| 6,666,031 B2 | 12/2003 | Ohkubo et al. |
| 7,417,206 B2 | 8/2008 | Nakamura |
| 8,109,328 B2 | 2/2012 | Takechi |
| 8,302,408 B2 | 11/2012 | Miki |
| 2003/0172657 A1 | 9/2003 | Ohkubo et al. |
| 2006/0096972 A1 | 5/2006 | Nakamura |
| 2008/0196863 A1 | 8/2008 | Takechi |
| 2008/0212642 A1 | 9/2008 | Takahashi |
| 2008/0236805 A1 | 10/2008 | Miki |

(Continued)

FOREIGN PATENT DOCUMENTS

| CN | 101275776 A | 10/2008 |
|---|---|---|
| CN | 101794766 | 8/2010 |

(Continued)

OTHER PUBLICATIONS

TW Office Action in TW Application No. 108140399, dated Apr. 29, 2020, 11 pages (with English translation).

(Continued)

*Primary Examiner* — Gregory E Webb
(74) *Attorney, Agent, or Firm* — Fish & Richardson P.C.

(57) ABSTRACT

A temperature adjustment device includes a flow path plate that includes a flow path groove, a heat transfer plate that faces the flow path groove, and a thermoelectric module plate that is connected to the heat transfer plate. A surface roughness of the flow path plate is 0.20 μm or more and 0.25 μm or less.

6 Claims, 7 Drawing Sheets

(56) References Cited

U.S. PATENT DOCUMENTS

| | | |
|---|---|---|
| 2010/0186424 A1 | 7/2010 | Horio |
| 2013/0152604 A1 | 6/2013 | Mimata et al. |
| 2013/0171493 A1 | 7/2013 | Wayne et al. |

FOREIGN PATENT DOCUMENTS

| | | | | |
|---|---|---|---|---|
| JP | H1167717 | | 3/1999 | |
| JP | 3085980 B2 | | 9/2000 | |
| JP | 2003338489 | | 11/2003 | |
| JP | 2006-145096 A | | 6/2006 | |
| JP | 2008186913 | | 8/2008 | |
| JP | 2008186913 A | * | 8/2008 | ......... G05D 23/1919 |
| JP | 2008202816 | | 9/2008 | |
| JP | 2010151427 | | 7/2010 | |
| JP | 2011077145 | | 4/2011 | |
| JP | 2012-080761 A | | 4/2012 | |
| JP | 2013113472 | | 6/2013 | |
| JP | 2013131345 | | 7/2013 | |
| JP | 3195255 | | 1/2015 | |
| TW | 200419128 A | | 10/2004 | |
| TW | I281833 | | 5/2007 | |

OTHER PUBLICATIONS

PCT International Search Report in International Application No. PCT/JP2019/042606, dated Dec. 24, 2019, 5 pages (with English translation).

* cited by examiner

TEMPERATURE ADJUSTMENT DEVICE AND METHOD FOR MANUFACTURING TEMPERATURE ADJUSTMENT DEVICE

CROSS-REFERENCE TO RELATED APPLICATIONS

This application is a National Stage application of International Application No. PCT/JP2019/042606, filed on Oct. 30, 2019, which claims priority to Japanese Patent Application No. 2018-214948, filed on Nov. 15, 2018. The contents of the prior applications are incorporated herein in their entirety.

FIELD

The present invention relates to a temperature adjustment device and a method for manufacturing a temperature adjustment device.

BACKGROUND

A semiconductor device is manufactured through a plurality of processes of a cleaning process of cleaning a semiconductor wafer, an applying process of applying a photoresist to the semiconductor wafer, an exposing process of exposing the semiconductor wafer to which the photoresist is applied, and an etching process of etching the exposed semiconductor wafer. In the cleaning process of the semiconductor wafer, the semiconductor wafer is cleaned with a temperature-adjusted liquid. Patent Literature 1 discloses an example of a fluid temperature adjustment device that adjusts a temperature of a liquid.

CITATION LIST

Patent Literature

Patent Literature 1: JP 2008-186913 A

SUMMARY

Technical Problem

When the liquid is contaminated, there is a possibility that defects in manufacturing the semiconductor device occur.

An aspect of the present invention aims to suppress the contamination of the liquid.

Solution to Problem

According to an aspect of the present invention, a temperature adjustment device comprises: a flow path plate that includes a flow path groove; a heat transfer plate that faces the flow path groove; and a thermoelectric module plate that is connected to the heat transfer plate, wherein a surface roughness of the flow path plate is 0.20 µm or more and 0.25 µm or less.

Advantageous Effects of Invention

According to the aspect of the present invention, the contamination of the liquid can be suppressed.

DESCRIPTION OF EMBODIMENTS

Hereinafter, embodiments according to the present invention will be described with reference to the drawings, but the present invention is not limited thereto. Components of the embodiments, which will be described below, can be combined appropriately. Some components may not be used.

In the following description, an XYZ orthogonal coordinate system is set, and a positional relationship of each part will be described with reference to the XYZ orthogonal coordinate system. A direction parallel to an X-axis in a predetermined plane is an X-axis direction. A direction parallel to a Y-axis orthogonal to the X-axis in the predetermined plane is a Y-axis direction. A direction parallel to a Z-axis orthogonal to the predetermined plane is a Z-axis direction. An XY plane including the X-axis and Y-axis is parallel to the predetermined plane. An YZ plane including the Y-axis and Z-axis is orthogonal to the XY plane. An XZ plane including the X-axis and Z-axis is orthogonal to the XY plane and YZ plane respectively. In the embodiment, the XY plane is parallel to a horizontal plane. The Z-axis direction is a vertical direction. A+Z direction (a +Z side) is an upper direction (an upper side). A −Z direction (a −Z side) is a lower direction (a lower side). The XY plane may be inclined with respect to the horizontal plane.

First Embodiment

<Cleaning System>

Figure 1:
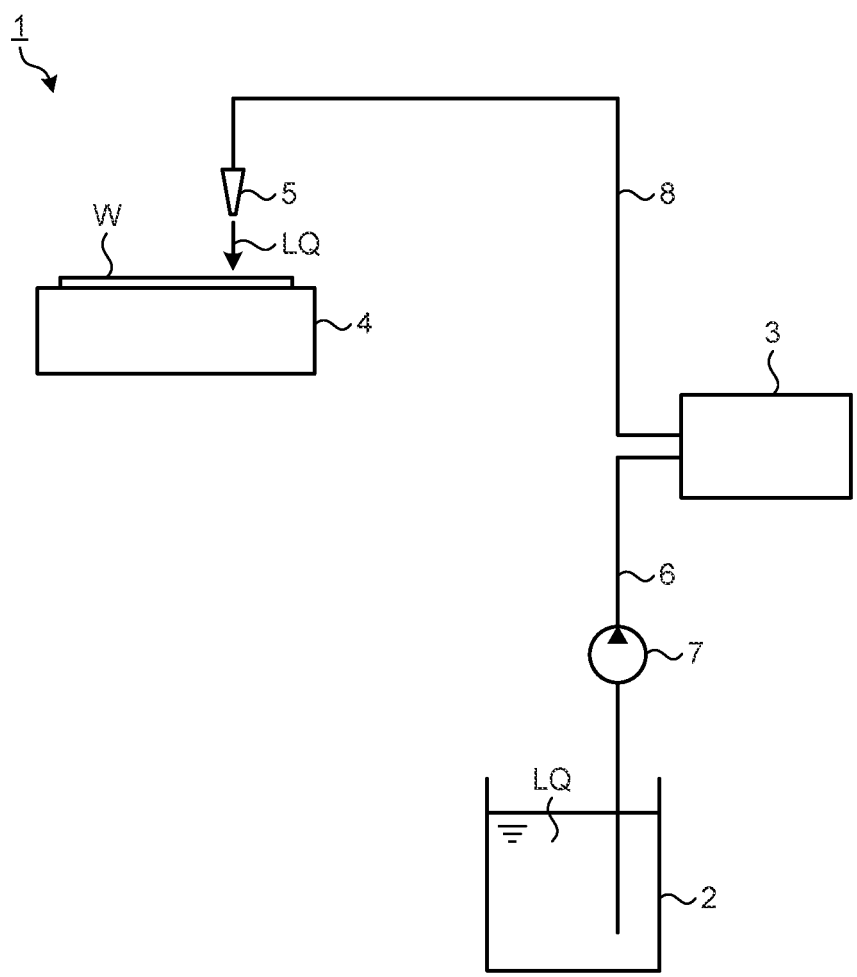
FIG. 1 is a diagram schematically illustrating an example of a cleaning system according to a first embodiment.

The first embodiment will be described. FIG. 1 is a diagram schematically illustrating an example of a cleaning system 1 according to the embodiment. The cleaning system 1 cleans a substrate W which is a cleaning target by using a cleaning liquid LQ. The substrate W includes, for example, a semiconductor wafer. The liquid LQ may be pure water or a chemical solution. As the chemical solution, at least one of an ammonia hydrogen peroxide mixture and a hydrochloric acid hydrogen peroxide mixture is exemplified.

The cleaning system 1 includes a storage tank 2 that stores the liquid LQ, a temperature adjustment device 3 that adjusts a temperature of the liquid LQ supplied from the storage tank 2, a substrate holding member 4 that holds the substrate W, a nozzle 5 that supplies the liquid LQ of which the temperature is adjusted by the temperature adjustment device 3 to the substrate W, a first connection pipe 6 that connects the storage tank 2 and the temperature adjustment device 3, a pump 7 that is disposed in the first connection pipe 6, and a second connection pipe 8 that connects the temperature adjustment device 3 and the nozzle 5.

The storage tank 2 stores the liquid LQ. When the pump 7 is driven, at least a part of the liquid LQ stored in the storage tank 2 is supplied to the temperature adjustment device 3 via the first connection pipe 6.

The temperature adjustment device 3 adjusts the temperature of the liquid LQ. The liquid LQ of which the temperature is adjusted by the temperature adjustment device 3 is supplied to the nozzle 5 via the second connection pipe 8. The nozzle 5 supplies the liquid LQ to the substrate W. The substrate W is cleaned by supplying the liquid LQ to the substrate W.

<Temperature Adjustment Device>

Figure 2:
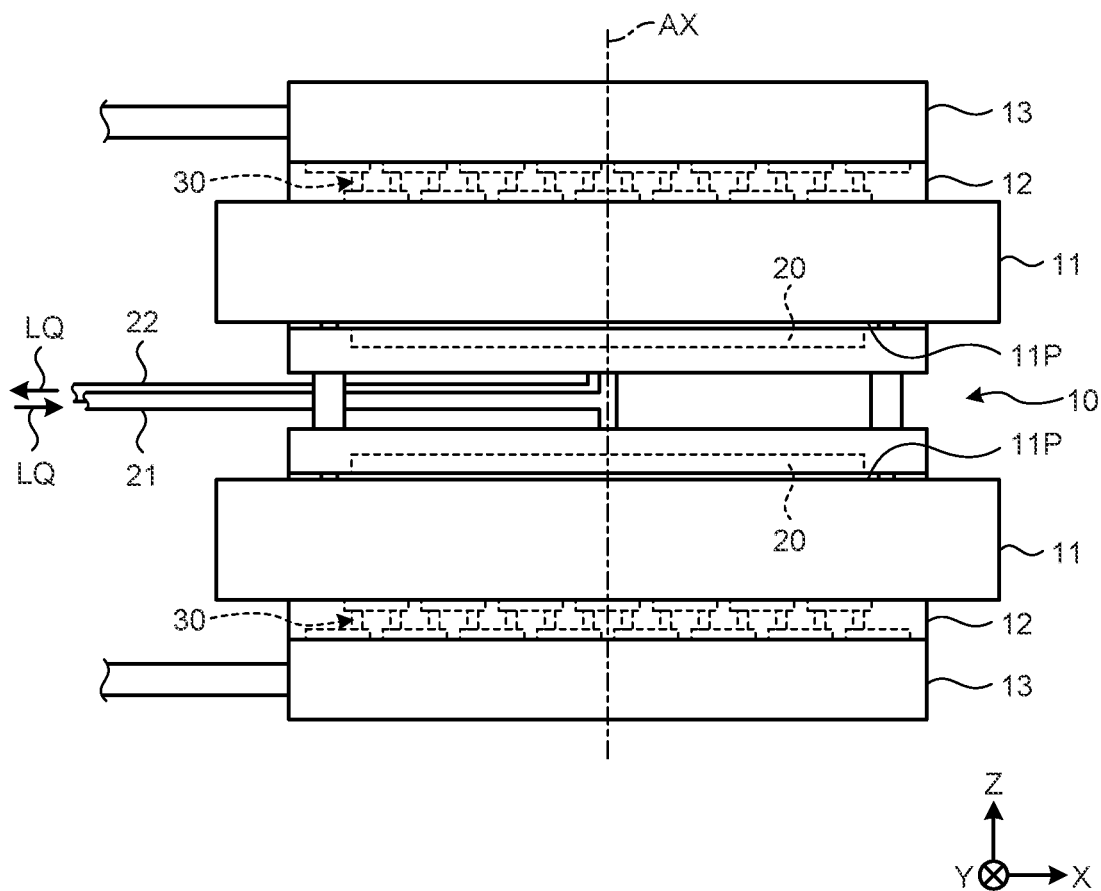
FIG. 2 is a side view schematically illustrating an example of a temperature adjustment device according to the first embodiment.

FIG. 2 is a side view schematically illustrating an example of a temperature adjustment device 3 according to the embodiment. As illustrated in FIG. 2, the temperature adjustment device 3 includes a main body 10, a pair of heat transfer plates 11 connected to an upper surface and a lower surface of the main body 10 respectively via a corrosion resistant plate 11P, a thermoelectric module plate 12 connected to each of one heat transfer plate 11 and the other heat transfer plate 11, and a pair of heat exchange plates 13 connected to each of one thermoelectric module plate 12 and the other thermoelectric module plate 12.

The main body 10 includes a flow path 20 through which the liquid LQ flows. The flow path 20 is provided on each of the upper surface and the lower surface of the main body 10. The flow path 20 faces the heat transfer plate 11. The main body 10 is formed of perfluoroalkoxy alkane (PFA) resin. The main body 10 may be formed of polytetrafluoroethylene (PTFE) or polyvinylidene difluoride (PVDF).

The flow path 20 is connected to a supply pipe 21. The supply pipe 21 is formed of PFA, PTFE, or PVDF. The liquid LQ supplied to the flow path 20 flows through the supply pipe 21. The supply pipe 21 is connected to the storage tank 2 via the first connection pipe 6. The liquid LQ of the storage tank 2 is supplied to the flow path 20 via the supply pipe 21.

The flow path 20 is connected to a discharge pipe 22. The discharge pipe 22 is formed of PFA, PTFE, or PVDF. The liquid LQ flowing through the flow path 20 is discharged to the discharge pipe 22. The liquid LQ discharged from the flow path 20 flows through the discharge pipe 22. The discharge pipe 22 is connected to the nozzle 5 via the second connection pipe 8. The liquid LQ of which the temperature is adjusted by the temperature adjustment device 3 is supplied to the nozzle 5 via the discharge pipe 22.

The corrosion resistant plate 11P includes, for example, an amorphous carbon. The corrosion resistant plate 11P has corrosion resistance to an acidic liquid LQ. The corrosion resistant plate 11P has thermal conductivity.

The heat transfer plate 11 exchanges heat with the liquid LQ flowing through the flow path 20 via the corrosion resistant plate 11P. The heat transfer plate 11 includes one heat transfer plate 11 facing the upper surface of the main body 10 and the other heat transfer plate 11 facing the lower surface of the main body 10. The heat transfer plate 11 is formed of, for example, aluminum.

The thermoelectric module plate 12 absorbs or generates heat to adjust the temperature of the liquid LQ flowing through the flow path 20. The thermoelectric module plate 12 includes one thermoelectric module plate 12 connected to the upper surface of one heat transfer plate 11, and the other thermoelectric module plate 12 connected to the lower surface of the other heat transfer plate 11. The thermoelectric module plate 12 includes a thermoelectric module 30 that absorbs or generates heat by supplying electric power. The thermoelectric module 30 absorbs or generates heat due to a Peltier effect.

The thermoelectric module 30 can take heat from the liquid LQ flowing through the flow path 20 via the heat transfer plate 11. The thermoelectric module 30 can give heat from the liquid LQ flowing through the flow path 20 via the heat transfer plate 11. The thermoelectric module 30 absorbs or generates heat to adjust the temperature of the liquid LQ flowing through the flow path 20.

The heat exchange plate 13 exchanges heat with the thermoelectric module plate 12. The heat exchange plate 13 includes one heat exchange plate 13 connected to the upper surface of one thermoelectric module plate 12, and the other heat exchange plate 13 connected to the lower surface of the other thermoelectric module plate 12. The heat exchange plate 13 has an internal flow path (not shown) through which a temperature adjustment fluid flows. The temperature adjustment fluid flows into the internal flow path through the inlet of the internal flow path after the temperature of the temperature adjustment fluid is adjusted by a fluid temperature adjustment device (not shown). The temperature adjustment fluid flows through the internal flow path to take heat from the heat exchange plate 13 or give heat to the heat exchange plate 13. The temperature adjustment fluid flows out from the outlet of the internal flow path, and is returned to the fluid temperature adjustment device.

In the embodiment, each of the main body 10, the heat transfer plate 11, the thermoelectric module plate 12, and the heat exchange plate 13 has substantially a disk shape. In the following description, a virtual axis that passes through the center of each of the main body 10, the heat transfer plate 11, the thermoelectric module plate 12, and the heat exchange plate 13 and is parallel to the Z-axis is appropriately referred to as a central axis AX.

<Thermoelectric Module>

Figure 3:
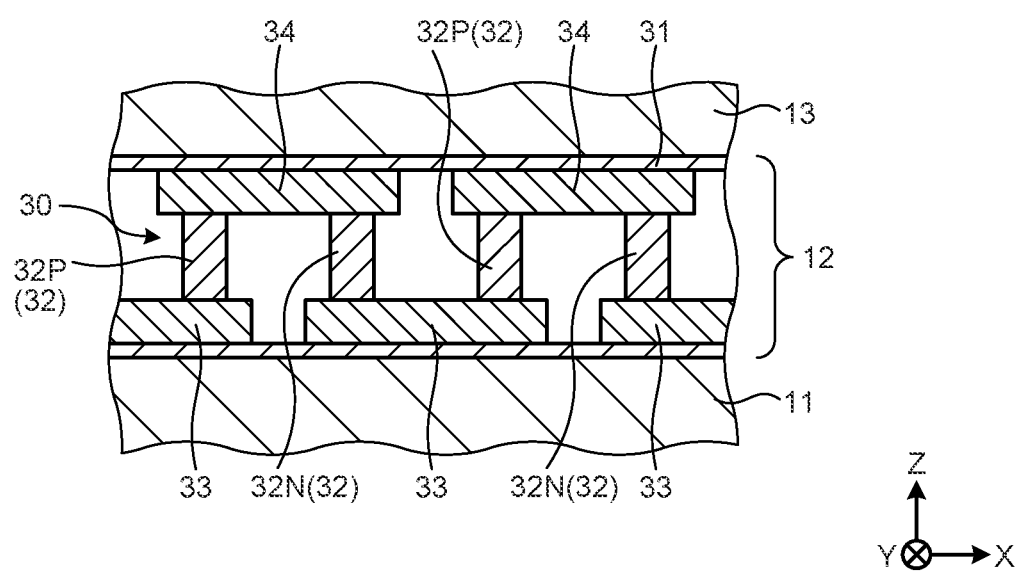
FIG. 3 is an enlarged cross-sectional view of a part of a thermoelectric module plate according to the first embodiment.

FIG. 3 is an enlarged cross-sectional view of a part of the thermoelectric module plate 12 according to the embodiment. As illustrated in FIG. 3, the thermoelectric module plate 12 includes a plurality of the thermoelectric modules 30, and a case 31 that accommodates a plurality of the thermoelectric modules 30. The case 31 is formed of an insulating material.

The thermoelectric module 30 includes a thermoelectric semiconductor element 32, a first electrode 33, and a second electrode 34. The thermoelectric semiconductor element 32 includes a p-type thermoelectric semiconductor element 32P, and an n-type thermoelectric semiconductor element 32N. In the XY plane, the p-type thermoelectric semiconductor element 32P, and the n-type thermoelectric semiconductor element 32N are arranged alternately. The first electrode 33 is connected to each of the p-type thermoelectric semiconductor element 32P, and the n-type thermoelectric semiconductor element 32N. The second electrode 34 is connected to each of the p-type thermoelectric semiconductor element 32P, and the n-type thermoelectric semiconductor element 32N. The first electrode 33 is adjacent to the heat transfer plate 11. The second electrode 34 is adjacent to the heat exchange plate 13. Each of one end face of the p-type thermoelectric semiconductor element 32P, and one end face of the n-type thermoelectric semiconductor element 32N is connected to the first electrode 33. Each of the other end face of the p-type thermoelectric semiconductor element 32P, and the other end face of the n-type thermoelectric semiconductor element 32N is connected to the second electrode 34.

The thermoelectric module 30 absorbs or generates heat due to a Peltier effect. When a potential difference is applied between the first electrode 33 and the second electrode 34, electric charges move in the thermoelectric semiconductor element 32. Due to the movement of the electric charges, heat is transferred in the thermoelectric semiconductor element 32. As a result, the thermoelectric module 30 absorbs or generates the heat. For example, when the potential difference is applied between the first electrode 33 and the second electrode 34 so that the first electrode 33 generates heat and the second electrode 34 absorbs heat, the liquid LQ flowing through the flow path 20 is heated. When the potential difference is applied between the first electrode 33 and the second electrode 34 so that the first electrode 33 absorbs heat and the second electrode 34 generates heat, the liquid LQ flowing through the flow path 20 is cooled.

<Main Body>

Figure 4:
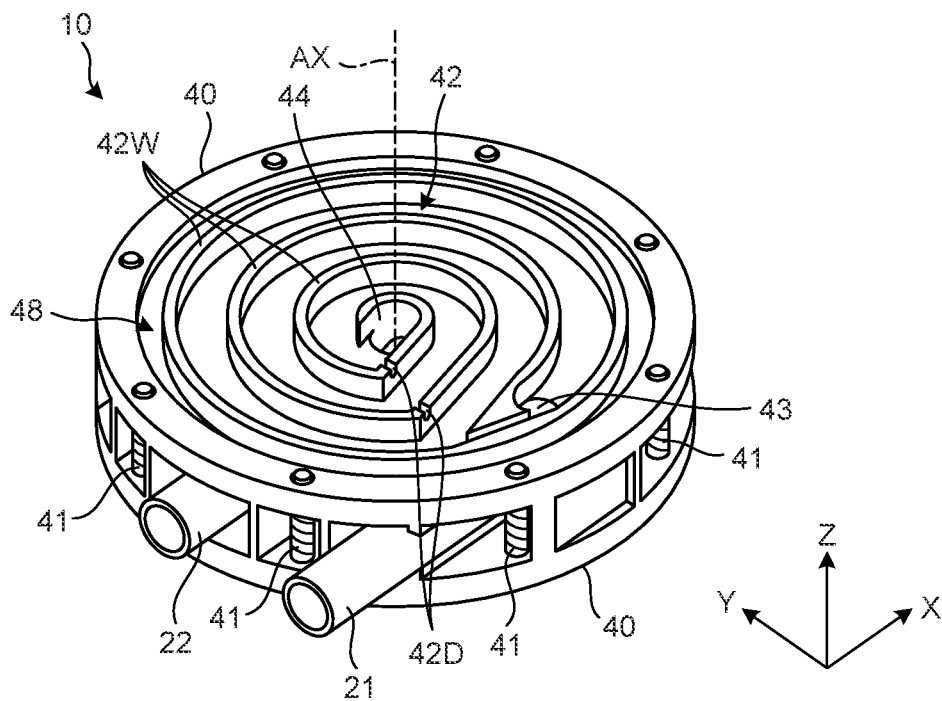
FIG. 4 is a perspective view illustrating an example of a main body of the temperature adjustment device according to the first embodiment.
Figure 5:
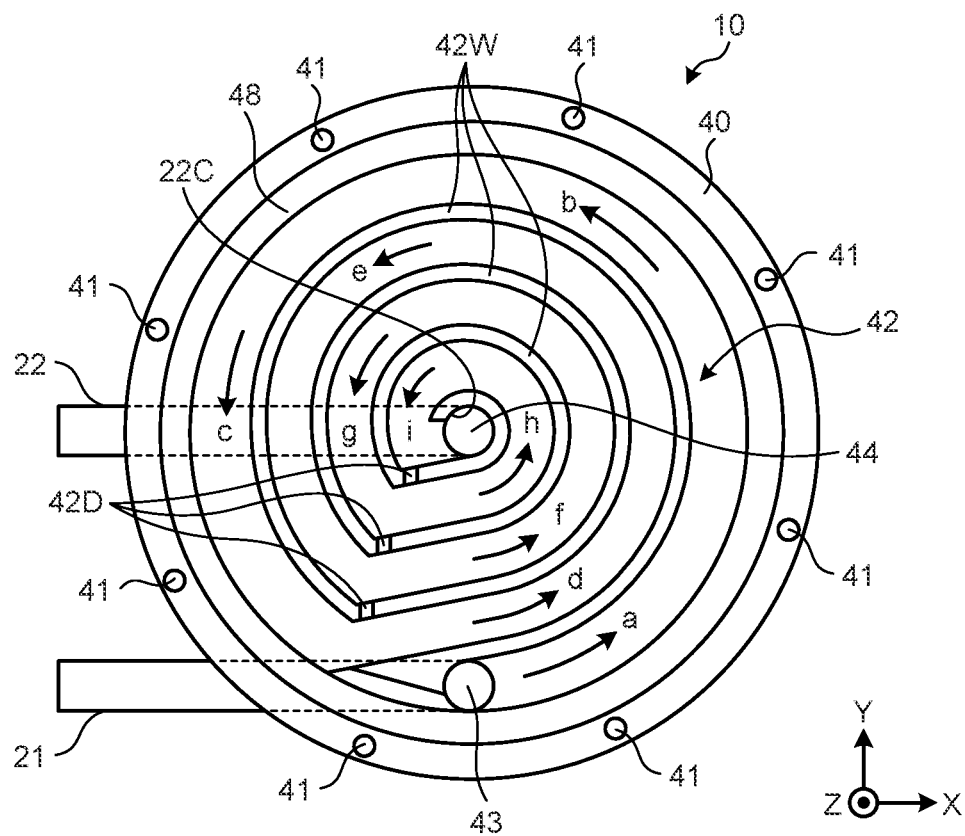
FIG. 5 is a plan view illustrating an example of the main body of the temperature adjustment device according to the first embodiment.
Figure 6:
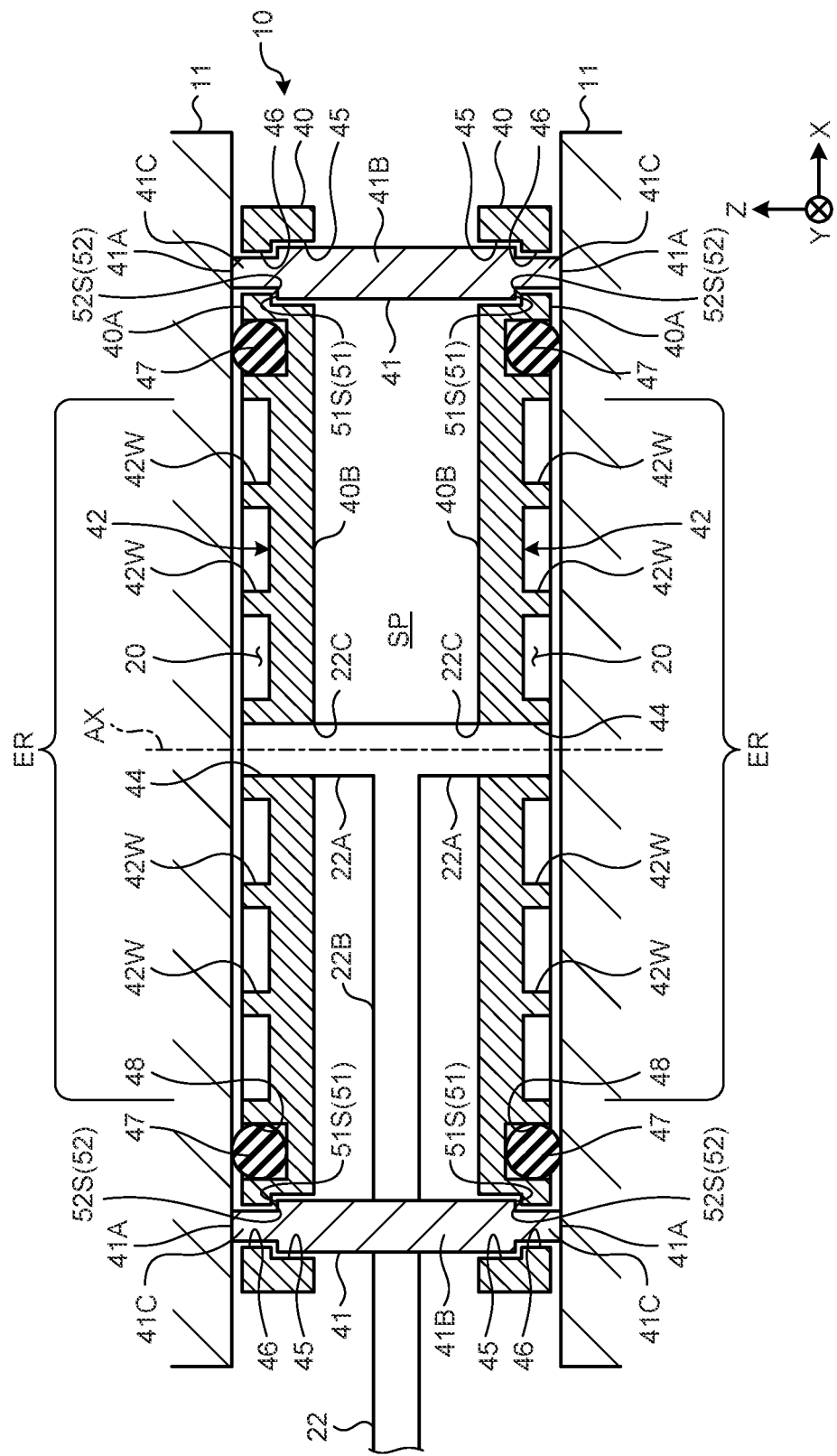
FIG. 6 is a cross-sectional view illustrating an example of the main body of the temperature adjustment device according to the first embodiment.

FIG. 4 is a perspective view illustrating an example of a main body 10 of a temperature adjustment device 3 according to the embodiment. FIG. 5 is a plan view illustrating an example of the main body 10 of the temperature adjustment device 3 according to the embodiment. FIG. 6 is a cross-sectional view illustrating an example of the main body 10 of the temperature adjustment device 3 according to the embodiment.

As illustrated in FIGS. 4, 5, and 6, the main body 10 includes a pair of flow path plates 40 having a front surface 40A and a back surface 40B respectively, and a spacer member 41 connecting a pair of the flow path plates 40. One flow path plate 40 faces one heat transfer plate 11. The other flow path plate 40 faces the other heat transfer plate 11. The spacer member 41 connects a pair of the flow path plates 40 so that the back surface 40B of one flow path plate 40 and the back surface 40B of the other flow path plate 40 face each other via a space SP.

One flow path plate 40 and the other flow path plate 40 have the same structure. Hereinafter, one flow path plate 40 will be mainly described, and the description of the other flow path plate 40 will be simplified or omitted.

The flow path plate 40 has a flow path groove 42 provided in at least a part of the front surface 40A. The flow path groove 42 is defined by a partition wall 42W. The flow path groove 42 is defined between a pair of the partition walls 42W. The heat transfer plate 11 faces the flow path groove 42. In a state in which the heat transfer plate 11 faces the flow path groove 42, an end face of the partition wall 42W is in contact with the heat transfer plate 11. The flow path groove 42 is covered by the heat transfer plate 11, and the flow path 20 is formed by the contact between the end face of the partition wall 42W and the heat transfer plate 11.

The flow path plate 40 includes a fluid supply port 43 for supplying the liquid LQ to the flow path groove 42, and a fluid discharge port 44 for discharging at least a part of the liquid LQ in the flow path groove 42. At least a part of the fluid discharge port 44 is disposed on the central axis AX of the flow path plate 40. The fluid supply port 43 is disposed outside of the fluid discharge port 44 in a radial direction of the central axis AX. The flow path groove 42 is provided in a spiral shape so as to connect the fluid supply port 43 and the fluid discharge port 44.

The partition wall 42W is provided in a spiral shape. A recess 42D connecting adjacent flow path grooves 42 is provided in a part of the partition wall 42W. The recess 42D is formed by cutting out a part of the end face of the partition wall 42W.

The main body 10 includes the supply pipe 21 through which the liquid LQ supplied to the flow path groove 42 flows, and the discharge pipe 22 through which the liquid LQ discharged from the flow path groove 42 flows. At least a part of the supply pipe 21 is disposed in the space SP between one flow path plate 40 and the other flow path plate 40. At least a part of the discharge pipe 22 is disposed in the space SP between one flow path plate 40 and the other flow path plate 40.

The supply pipe 21 includes a collection pipe and a branch pipe connected to each of the fluid supply port 43 of one flow path plate 40 and the fluid supply port 43 of the other flow path plate 40. An outlet of the branch pipe and the fluid supply port 43 are connected.

As illustrated in FIG. 6, the discharge pipe 22 includes a branch pipe 22A connected to each of the fluid discharge port 44 of one flow path plate 40 and the fluid discharge port 44 of the other flow path plate 40, and a collection pipe 22B connected to a pair of branch pipes 22A. An inflow port 22C of the branch pipe 22A and the fluid discharge port 44 are connected to each other. At least a part of the inflow port 22C of the discharge pipe 22 (the branch pipe 22A) is disposed on the central axis AX.

The flow path plate 40 is formed of a synthetic resin. In the embodiment, the flow path plate 40 is formed of perfluoroalkoxy alkane (PFA) resin. The flow path plate 40 may be formed of polytetrafluoroethylene (PTFE) or polyvinylidene difluoride (PVDF).

In the embodiment, the flow path plate 40 is manufactured by injection-molding. A surface roughness R of the flow path plate 40 that is injection-molded is 0.20 μm or more and 0.25 μm or less.

In the embodiment, the surface roughness R is a calculated average roughness Ra. That is, the calculated average roughness Ra of the flow path plate 40 is 0.20 μm or more and 0.25 μm or less.

The surface roughness R may be a maximum height roughness Rz. That is, the maximum height roughness Rz of the flow path plate 40 may be 0.20 μm or more and 0.25 μm or less.

For example, as regulated in JIS B 0601 (ISO 4287), an arithmetic average roughness Ra means an average value of absolute values of a contour curve having a height in a reference length. The maximum height roughness Rz is the sum of the height of the highest peak and the depth of the deepest valley of the contour curve having the height in the reference length.

The spacer member 41 is formed of a material having a thermal expansion coefficient smaller than that of the flow path plate 40. A heat deformation amount of the spacer member 41 in the Z-axis direction is smaller than a heat deformation amount of the flow path plate 40. The spacer member 41 is formed of, for example, stainless steel or carbon. The spacer member 41 includes a columnar body 41B, and columnar projection portions 41C projecting upward and downward from the body 41B, respectively. The diameter of the body 41B is larger than the diameter of a projection portion 41C. A step portion 51 is formed at the boundary between the body 41B and the projection portion 41C. The step portion 51 includes a support surface 51S parallel to the XY plane.

At least a part of the body 41B is disposed in a recess 45 provided in the back surface 40B of the flow path plate 40. The projection portion 41C is inserted into a hole 46 connected to the recess 45. The hole 46 is a through hole connecting the end face of the recess 45 and the front surface 40A. The diameter of the recess 45 is larger than the diameter of the hole 46. A step portion 52 is formed at the boundary between the recess 45 and the hole 46. The step portion 52 includes a contact surface 52S parallel to the XY plane.

The shape of the step portion 51 provided in the spacer member 41 and the shape of the step portion 52 provided in the flow path plate 40 substantially match. The projection portion 41C is inserted into the hole 46, and at least a part of the body 41B is disposed in the recess 45 so that the support surface 51S and the contact surface 52S come into contact with each other. As a result, the relative position of the flow path plate 40 and the spacer member 41 in the Z-axis direction is fixed. The projection portion 41C is inserted into the hole 46, and at least a part of the body 41B is disposed in the recess 45 so that the outer surface of the projection portion 41C and the inner surface of the hole 46 come into contact with each other, and the outer surface of the body 41B and the inner surface of the recess 45 come into contact with each other. As a result, the relative position of the flow path plate 40 and the spacer member 41 in the XY plane is fixed.

At least a part of the projection portion 41C projecting upward from the body 41B projects upward from the front surface 40A of one flow path plate 40. At least a part of the projection portion 41C projecting downward from the body 41B projects downward from the front surface 40A of the other flow path plate 40.

The projection portion 41C includes a support surface 41A projecting from the front surface 40A of the flow path plate 40. The support surface 41A of the projection portion 41C projecting upward from the body 41B is disposed in the +Z side from the front surface 40A of one flow path plate 40. The support surface 41A of the projection portion 41C projecting downward from the body 41B is disposed in the −Z side from the front surface 40A of the other flow path plate 40.

The heat transfer plate 11 is supported by the support surface 41A of the spacer member 41.

As described above, the flow path groove 42 is provided in a spiral shape. The flow path groove 42 is provided in a specific region ER of the front surface 40A of the flow path plate 40. The specific region ER is a partial region of the front surface 40A. The specific region ER is provided in a center portion of the front surface 40A. A plurality of the spacer members 41 are provided so as to surround the specific region ER in which the flow path groove 42 is provided. In the embodiment, eight spacer members 41 are provided around the specific region ER.

The main body 10 includes a seal member 47 that seals the boundary between the front surface 40A of the flow path plate 40 and the heat transfer plate 11. The seal member 47 includes, for example, an O-ring. The seal member 47 is disposed around the specific region ER on the front surface 40A. The spacer member 41 is connected to the flow path plate 40 in the outside of the seal member 47. That is, the spacer member 41 is disposed outside of the seal member 47 in the radial direction of the central axis AX.

A seal groove 48 in which the seal member 47 is disposed is provided around the flow path groove 42. The seal member 47 is in contact with the heat transfer plate 11 facing the flow path groove 42 in a state in which the seal member 47 is disposed in the seal groove 48.

<Manufacturing Method>

Figure 7:
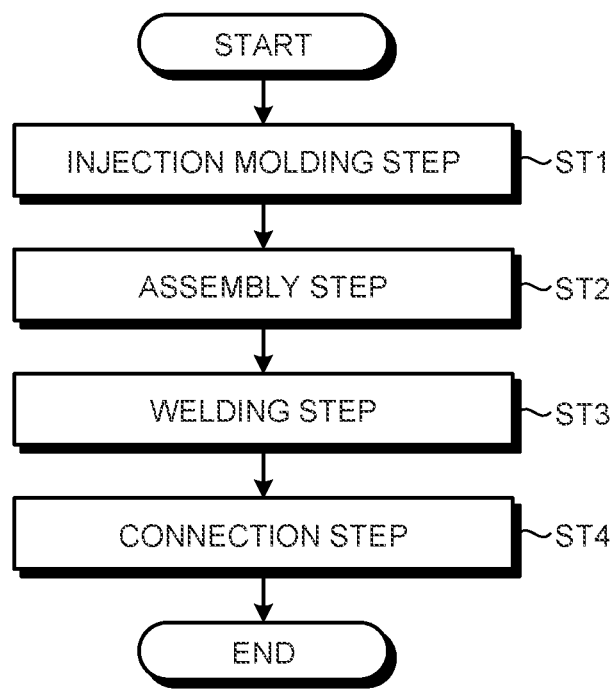
FIG. 7 is a flowchart illustrating an example of a method for manufacturing a temperature adjustment device according to a first embodiment.

Next, a method for manufacturing a temperature adjustment device 3 according to the embodiment will be described. FIG. 7 is a flowchart illustrating an example of the method 3 for manufacturing a temperature adjustment device according to the embodiment.

An injection molding step of manufacturing the flow path plate 40 is executed by injection-molding the synthetic resin (Step ST1). In the injection-molding step, the synthetic resin for manufacturing the flow path plate 40 is supplied to an injection-molding machine. The synthetic resin contains PFA. The synthetic resin may contain PTFE. The injection-molding machine includes a mold for manufacturing the flow path plate 40, and an injection device for injecting the molten synthetic resin into the mold. By solidifying the synthetic resin in the mold, the flow path plate 40 having the flow path groove 42 on at least a part of the front surface 40A is manufactured.

An inner surface of the mold is smooth. That is, the surface roughness of the inner surface of the mold is sufficiently small. The surface roughness R of the front surface of the flow path plate 40 manufactured by the mold is also sufficiently small. As described above, by using the injection-molding method for manufacturing the flow path plate 40, the surface roughness of the flow path plate 40 can be made to be 0.20 μm or more and 0.25 μm or less.

After the flow path plate 40 is manufactured by injection-molding, an assembly step of assembling the main body 10 is executed (Step ST2). In the assembly step, for example, the projection portion 41C of the spacer member 41 is inserted into the hole 46 provided in the flow path plate 40. The projection portion 41C is inserted into the hole 46 so that the support surface 41A projects from the front surface 40A. The projection portion 41C is inserted into the hole 46 so that at least a part of the body 41B is disposed in the recess 45. The projection portion 41C is inserted into the hole 46, and at least a part of the body 41B is inserted into the recess 45 so that the support surface 51S comes into contact with the contact surface 52S, the outer surface of the projection portion 41C and the inner surface of the hole 46 come into contact with each other, and the outer surface of the body 41B and the inner surface of the recess 45 come into contact with each other. As a result, the relative position of the flow path plate 40 and the spacer member 41 is fixed in each of the six directions of the X-axis, Y-axis, Z-axis, θX, θY, and θZ directions.

A welding step of welding the flow path plate 40 to each of the supply pipe 21 and the discharge pipe 22 is executed (Step ST3). The flow path plate 40, the supply pipe 21, and the discharge pipe 22 are formed of the same material. When the flow path plate 40 is formed of PFA, the supply pipe 21, and the discharge pipe 22 are also formed of PFA. When the flow path plate 40 is formed of PTFE, the supply pipe 21, and the discharge pipe 22 are also formed of PTFE.

At least a part of the flow path plate 40 is in a molten state by heating, and at least a part of the supply pipe 21 is in a molten state by heating. As a result, the flow path plate 40, and the supply pipe 21 are welded to each other. The flow path plate 40 and the supply pipe 21 are welded so as to connect the fluid supply port 43 of the flow path plate 40 and the flow path of the supply pipe 21.

At least a part of the flow path plate 40 is in a molten state by heating, and at least a part of the discharge pipe 22 is in a molten state by heating. As a result, the flow path plate 40, and the discharge pipe 22 are welded to each other. The flow path plate 40 and the discharge pipe 22 are welded so as to connect the fluid discharge port 44 of the flow path plate 40 and the flow path of the discharge pipe 22.

A connection step of connecting the flow path plate 40 and the heat transfer plate 11 is executed (Step ST4). After the seal member 47 is disposed in the seal groove 48, the heat transfer plate 11 is disposed so as to face the flow path groove 42, and the flow path plate 40 and the heat transfer plate 11 are connected to each other. The heat transfer plate 11 is disposed so as to cover the flow path groove 42. The support surface 41A of the spacer member 41 projects from the front surface 40A of the flow path plate 40. Therefore, the heat transfer plate 11 is in contact with the support surface 41A of the spacer member 41. The heat transfer plate 11 is supported by the spacer member 41. The heat transfer plate 11 is in contact with the seal member 47. As a result, the flow path 20 is formed between the heat transfer plate 11 and the flow path plate 40.

A step of connecting the thermoelectric module plate 12 to the heat transfer plate 11 and a step of connecting the heat exchange plate 13 to the thermoelectric module plate 12 are executed. As described above, the temperature adjustment device 3 is manufactured.

<Operation>

Next, an operation of the temperature adjustment device 3 according to the embodiment will be described. The liquid LQ is supplied to the flow path groove 42 (the flow path 20) via the supply pipe 21, and the fluid supply port 43. The liquid LQ flows toward the fluid discharge port 44 while being guided by the flow path groove 42. In the embodiment, the flow path groove 42 has a spiral shape. The liquid LQ supplied from the fluid supply port 43 to the flow path groove 42 flows in a direction indicated by each of an arrow a, an arrow b, an arrow c, an arrow d, an arrow e, an arrow f, an arrow g, an arrow h, and an arrow i illustrated in FIG. 5, and then is discharged from the fluid discharge port 44.

When the potential difference is applied to the thermoelectric module 30, the temperature adjustment device 3 starts to adjust the temperature of the liquid LQ flowing through the flow path groove 42. The temperature of the liquid LQ flowing through the flow path groove 42 is adjusted by the thermoelectric module 30 absorbing or generating heat.

The seal member 47 seals the boundary between the front surface 40A and the heat transfer plate 11 in the outside of the flow path groove 42. Therefore, the leakage of the liquid LQ from the main body 10 is suppressed.

The liquid LQ flowing through the flow path groove 42 is discharged through the fluid discharge port 44. In the embodiment, at least a part of the fluid discharge port 44 is disposed on the central axis AX of the flow path plate 40. At least a part of the inflow port 22C of the discharge pipe 22 is also disposed on the central axis AX. That is, in the XY plane, a position of the fluid discharge port 44 provided in the flow path plate 40 and a position of the inflow port 22C provided in the discharge pipe 22 coincide with each other. Therefore, the occurrence of stagnation when the liquid LQ is discharged from the flow path groove 42 to the discharge pipe 22 is suppressed.

<Effect>

As described above, according to the embodiment, the flow path plate 40 in contact with the liquid LQ is manufactured by injection-molding. The release of foreign matter from the flow path plate 40 is suppressed. Therefore, contamination of the liquid LQ is suppressed.

For example, when the flow path plate is manufactured by a cutting process using a metal tool such as a cutting tool, at least a part of the metal tool may remain on the flow path plate. For example, metal powders generated from the metal tool in the cutting process may remain on the flow path plate. When the liquid LQ is supplied to the flow path plate in a state in which the metal powders remain on the flow path plate, the liquid LQ may be contaminated by the metal powders. When the substrate W is cleaned with the liquid LQ containing the metal powders, the metal powders may adhere to the substrate W, and manufacturing defects of the semiconductor device may occur.

In the embodiment, the flow path plate 40 is manufactured by injection-molding using the mold. In the injection-molding, it is unlikely that the foreign matter will remain on the flow path plate 40. Therefore, even when the flow path plate 40 and the liquid LQ come into contact with each other, contamination of the liquid LQ is suppressed. Accordingly, an occurrence of the manufacturing defects of the semiconductor device is suppressed.

In the embodiment, since the flow path plate 40 is manufactured by the injection-molding using the mold, the surface roughness R of the front surface of the flow path plate 40 can be sufficiently reduced. By using the injection-molding method for manufacturing the flow path plate 40, the surface roughness of the flow path plate 40 can be made to be 0.20 μm or more and 0.25 μm or less. For example, when the flow path plate is manufactured by the cutting process with the metal tool, it is difficult to make the surface roughness R of the flow path plate 0.50 μm or less. According to the embodiment, the flow path plate 40 having a smooth front surface can be manufactured by the injection-molding. By manufacturing the flow path plate 40 having a smooth front surface, even when the foreign matter is present on the front surface of the flow path plate 40, the foreign matter is easily removed from the front surface of the flow path plate 40 by the flow of the fluid. Therefore, the flow path plate 40 is prevented from being a source of the foreign matter.

Figure 8:
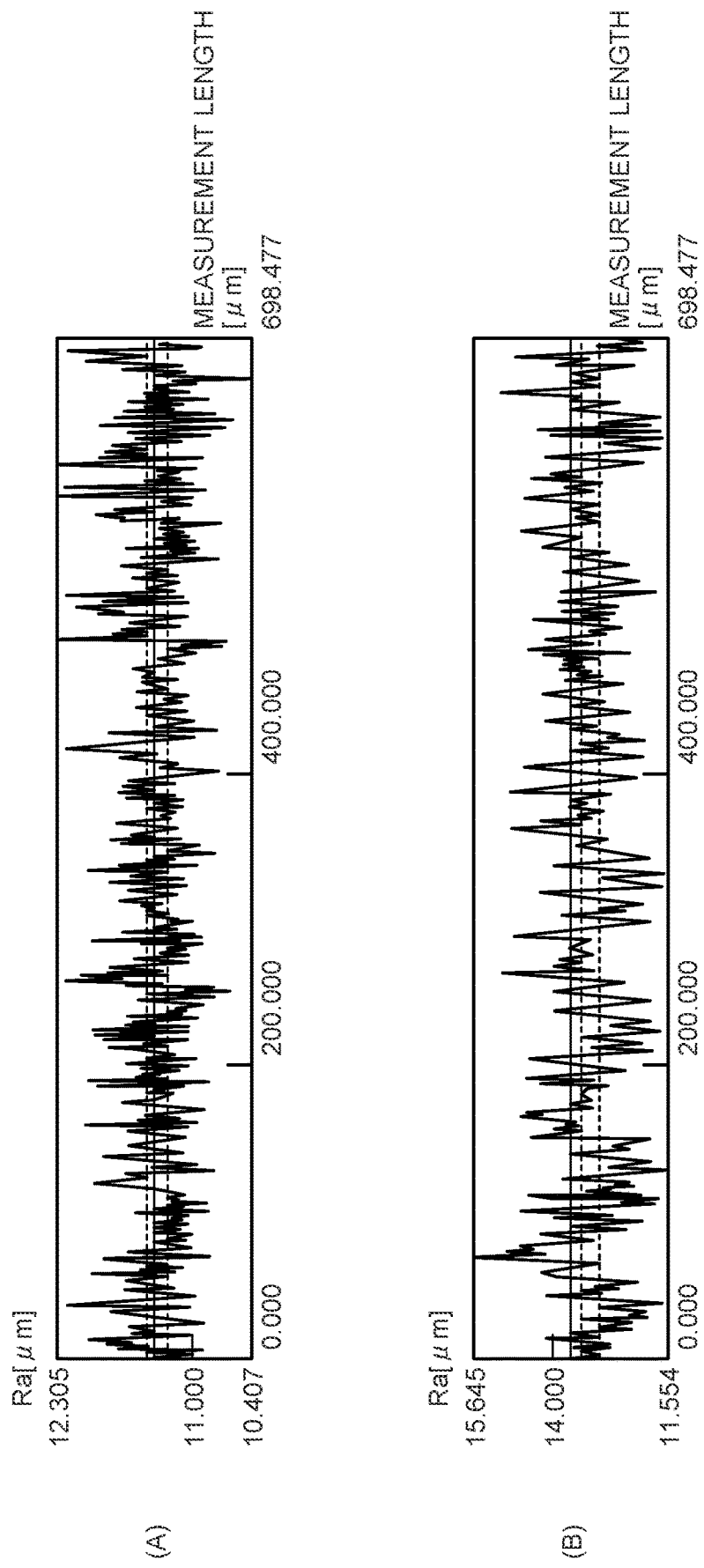
FIG. 8 is a diagram illustrating an example of a measurement result of a surface roughness of a flow path plate.

FIG. 8 is a graph illustrating an example of a measurement result of a surface roughness R (an arithmetic average roughness Ra) of the flow path plate 40. FIG. 8(A) illustrates the measurement result of the surface roughness R of the flow path plate 40 manufactured by the injection-molding. FIG. 8(B) is a graph illustrating the measurement result of the surface roughness R of the flow path plate 40 manufactured by the cutting process. In the graph illustrated in FIG. 8, a horizontal axis shows the measurement length [μm] on the front surface of the flow path plate 40, and a vertical axis shows the arithmetic average roughness Ra [μm].

As illustrated in FIG. 8(A), since the flow path plate 40 is manufactured by the injection molding, the surface roughness R of the flow path plate 40 can be reduced. In the measurement result illustrated in FIG. 8(A), the arithmetic surface roughness Ra of the flow path plate 40 was 0.209 μm.

As illustrated in FIG. 8(B), since the flow path plate 40 is manufactured by the cutting process, the surface roughness R of the flow path plate 40 can be increased. In the measurement result illustrated in FIG. 8(B), the arithmetic surface roughness Ra of the flow path plate 40 was 0.508 μm.

In this way, it was confirmed that the surface roughness R of the front surface of the flow path plate 40 can be reduced since the flow path plate 40 is manufactured by the injection-molding.

In the embodiment, the flow path plate 40 and the supply pipe 21 are connected by welding. For example, when the flow path plate 40 and the supply pipe 21 are connected by overlay welding, a part of a padding portion or a welding rod, which is a substance different from the flow path plate 40 and the supply pipe 21, may be peeled off from the front surface of the flow path plate 40 or a surface of the supply pipe 21 by the flow of the fluid, and released as the foreign matter. According to this embodiment, the flow path plate 40 and the supply pipe 21 are connected by welding. Therefore, it is possible to prevent the foreign matter from being released from a connection portion between the flow path plate 40 and the supply pipe 21. The flow path plate 40 and the discharge pipe 22 are connected by welding. Therefore, it is possible to prevent the foreign matter from being released from a connection portion between the flow path plate 40 and the discharge pipe 22.

In the embodiment, each of the flow path plate 40, the supply pipe 21, and the discharge pipe 22 is formed of PFA. Therefore, contamination of the liquid LQ is suppressed.

In the embodiment, the spacer member 41 is disposed between a pair of the flow path plates 40. A heat deformation amount of the spacer member 41 in the Z-axis direction is smaller than a heat deformation amount of the flow path plate 40. Therefore, the relative position (a relative distance) between one flow path plate 40 and the other flow path plate 40 in the Z-axis direction is maintained. The heat transfer plate 11 is supported by the support surface 41A of the spacer member 41. Therefore, the relative position (a relative distance) between one heat transfer plate 11 and the other heat transfer plate 11 in the Z-axis direction is maintained. The main body 10 in which the relative position of a pair of the flow path plates 40 is maintained can be assembled only by inserting the projection portion 41C of the spacer member 41 into the hole 46 of the flow path plate 40. Therefore, when the temperature adjustment device 3 is configured of a plurality of members including a pair of the flow path plates 40 and a pair of the heat transfer plates 11, the assembly work is easy and the relative position of the plurality of members can be maintained.

The seal member 47 that seals the boundary between the front surface 40A of the flow path plate 40 and the heat transfer plate 11 is provided. Therefore, the liquid LQ flowing through the flow path groove 42 is prevented from leaking from the main body 10.

The flow path groove 42 is provided in a specific region ER of the front surface 40A of the flow path plate 40. The seal member 47 is disposed around the specific region ER on the front surface 40A. The spacer member 41 is connected to the flow path plate 40 in the outside of the seal member 47. Therefore, the liquid LQ flowing through the flow path groove 42 is prevented from leaking from the main body 10, and the contact between the spacer member 41 and the liquid LQ is suppressed. Since the contact between the spacer member 41 and the liquid LQ is suppressed, thermal deformation of the spacer member 41 due to the temperature of the liquid LQ is suppressed.

A plurality of the spacer members 41 are provided so as to surround the specific region ER. As a result, not only the relative position of a pair of the flow path plates 40 in the Z-axis direction but also the relative position of a pair of the flow path plates 40 in the XY plane are maintained.

At least a part of the supply pipe 21 is disposed in the space SP between one flow path plate 40 and the other flow path plate 40. As a result, the increase in size of the temperature adjustment device 3 is suppressed. The supply pipe 21 can evenly distribute the liquid LQ to each of one flow path plate 40 and the other flow path plate 40.

At least a part of the discharge pipe 22 is disposed in the space SP between one flow path plate 40 and the other flow path plate 40. As a result, the increase in size of the temperature adjustment device 3 is suppressed. The discharge pipe 22 can evenly accommodate the liquid LQ discharged from each of one flow path plate 40 and the other flow path plate 40.

At least a part of the fluid discharge port 44 of the flow path plate 40 is disposed on the central axis AX. At least a part of the inflow port 22C of the discharge pipe 22 is also disposed on the central axis AX. That is, the fluid discharge port 44 and at least a part of the inflow port 22C overlap with each other in the XY plane. Therefore, the liquid LQ discharged from the fluid discharge port 44 flows into the discharge pipe 22 from the inflow port 22C without stagnation. Contamination of the liquid LQ is suppressed by suppressing the occurrence of stagnation when the liquid LQ is discharged from the flow path groove 42 to the discharge pipe 22.

The fluid supply port 43 is disposed outside of the fluid discharge port 44 in a radial direction of the central axis AX. The flow path groove 42 is provided in a spiral shape so as to connect the fluid supply port 43 and the fluid discharge port 44. Therefore, it is possible to increase the distance between the fluid supply port 43 and the fluid discharge port 44, which is a portion in which the temperature of the liquid LQ is adjusted while suppressing the increase in size of the temperature adjustment device 3. The temperature of the liquid LQ is adjusted with high accuracy by increasing the length of the portion in which the temperature of the liquid LQ is adjusted.

Second Embodiment

The second embodiment will be described. In the following description, the same components as in the above-described embodiment are denoted by the same reference numerals, and the description thereof will be simplified or omitted.

Figure 9:
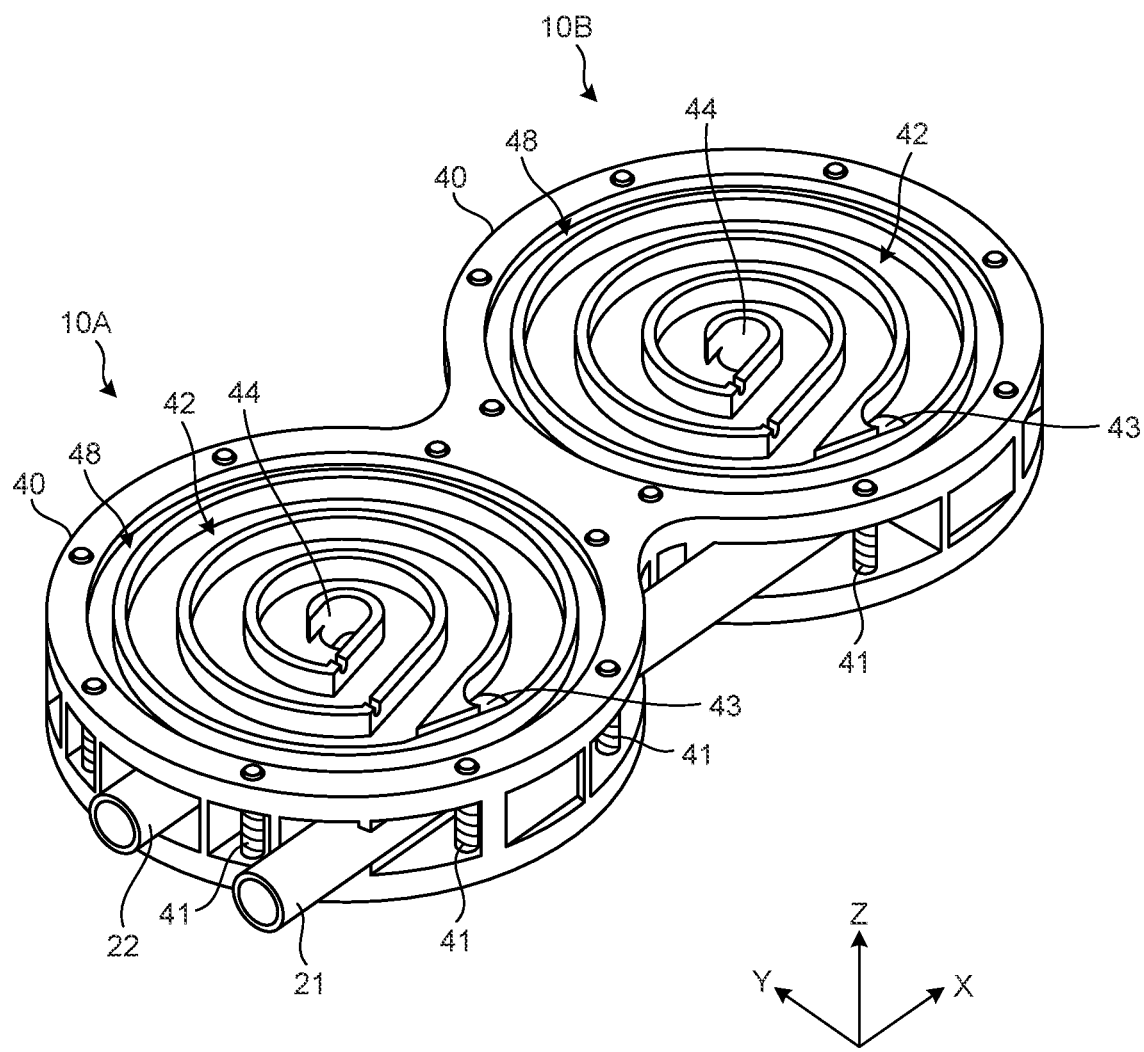
FIG. 9 is a perspective view illustrating an example of a main body of a temperature adjustment device according to a second embodiment.

FIG. 9 is a perspective view illustrating an example of a main body 10 of a temperature adjustment device 3 according to the embodiment. As illustrated in FIG. 9, the main body 10 includes a first main body 10A, and a second main body 10B connected to the first main body 10A. A structure of each of the first main body 10A and the second main body 10B is the same as that of the main body 10 according to the above-described embodiment. A heat transfer plate 11, a thermoelectric module plate 12, and a heat exchange plate 13 as described in the above-described embodiment are connected to each of the first main body 10A and the second main body 10B.

A supply pipe 21 is connected to each of a fluid supply port 43 of the first main body 10A and a fluid supply port 43 of the second main body 10B. A liquid LQ flowing through a supply pipe 21 is distributed to each of the fluid supply port 43 of the first main body 10A and the fluid supply port 43 of the second main body 10B.

The liquid LQ flowing through a flow path groove 42 of the first main body 10A is discharged to a discharge pipe 22 through a fluid discharge port 44. The liquid LQ flowing through the flow path groove 42 of the second main body 10B is discharged to the discharge pipe 22 through the fluid discharge port 44. The liquid LQ discharged from each of the fluid discharge port 44 of the first main body 10A and the fluid discharge port 44 of the second main body 10B is collected in the discharge pipe 22 and then supplied to a nozzle 5.

As described above, the temperature adjustment device 3 may include the first main body 10A, and the second main body 10B. Accordingly, for example, even in a situation where a large amount of the liquid LQ is required for cleaning a substrate W, the temperature adjustment device 3 can supply a large amount of the liquid LQ of which the temperature is adjusted to the substrate W.

OTHER EMBODIMENTS

In the above-described embodiment, the temperature adjustment device 3 adjusts the temperature of the liquid LQ. The temperature adjustment device 3 may adjust a temperature of a gas. By supplying the gas to the flow path groove 42, the temperature adjustment device 3 can adjust the temperature of the gas flowing through the flow path groove 42 by using the thermoelectric semiconductor element 32.

The invention claimed is:

1. A temperature adjustment device comprising:
a flow path plate that includes a flow path groove;
a heat transfer plate that faces the flow path groove; and
a thermoelectric module plate that is connected to the heat transfer plate,
wherein a surface roughness of the flow path plate is 0.20 μm or more and 0.25 μm or less.

2. The temperature adjustment device according to claim 1, wherein the flow path plate is formed of a synthetic resin.

3. The temperature adjustment device according to claim 1,
wherein the flow path plate includes a pair of flow path plates;
a spacer member that includes a support surface projecting from a front surface of the flow path plate, and connects a pair of the flow path plates such that a back surface of one of the pair of the flow path plates and a back surface of the other of the pair of the flow path plates face each other is provided; and
the heat transfer plate is supported by the support surface.

4. A method for manufacturing a temperature adjustment device, the method comprising:
manufacturing a flow path plate including a flow path groove by injection-molding a synthetic resin;
causing the flow path groove to face a heat transfer plate, and connecting the flow path plate to the heat transfer plate; and
connecting a thermoelectric module plate to the heat transfer plate.

5. The method for manufacturing a temperature adjustment device according to claim 4, wherein a surface roughness of the flow path plate that is injection-molded is 0.20 μm or more and 0.25 μm or less.

6. The method for manufacturing a temperature adjustment device according to claim 4, wherein the synthetic resin contains a perfluoroalkoxy alkane resin.

* * * * *